United States Patent
Misawa et al.

(10) Patent No.: US 6,972,608 B2
(45) Date of Patent: Dec. 6, 2005

(54) CLOCK GENERATING CIRCUIT WITH A FREQUENCY MULTIPLYING CIRCUIT

(75) Inventors: Katsutoyo Misawa, Nukata-gun (JP); Hideaki Ishihawa, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/778,120

(22) Filed: Feb. 17, 2004

(65) Prior Publication Data

US 2004/0164814 A1    Aug. 26, 2004

(30) Foreign Application Priority Data

Feb. 25, 2003    (JP) .............................. 2003-047471

(51) Int. Cl.$^7$ ............................................ H03K 3/00
(52) U.S. Cl. ...................................... 327/291; 327/292
(58) Field of Search ................................ 327/141, 291, 327/292, 294, 299; 331/1 A, 25, DIG. 2

(56) References Cited

U.S. PATENT DOCUMENTS

| 5,517,155 | A | * | 5/1996 | Yamauchi et al. .......... 331/1 A |
| 5,789,985 | A | * | 8/1998 | Yamauchi et al. .......... 331/1 A |
| 6,515,519 | B1 | | 2/2003 | Miyazaki et al. ........... 327/105 |

FOREIGN PATENT DOCUMENTS

JP    A-2000-357947    12/2000

* cited by examiner

Primary Examiner—Linh My Nguyen
(74) Attorney, Agent, or Firm—Posz Law Group, PLC (57) ABSTRACT

A reference clock oscillating circuit intermittently carries out an oscillating operation on the basis of an oscillation control signal from an oscillation control circuit. A frequency multiplying circuit successively measures the period of a reference clock signal by using a measuring clock signal generated therein during a period for which the reference clock signal is input from the reference clock oscillating circuit, and generates a multiplied clock signal by using the period data thus measured. During a period for which no reference clock signal is input, the multiplied clock signal is generated by using the period data stored in a period data register. The interval of the intermittent oscillating operation is set on the basis of temperature variation of IC or the like.

10 Claims, 5 Drawing Sheets

CLOCK GENERATING CIRCUIT WITH A FREQUENCY MULTIPLYING CIRCUIT

CROSS REFERENCE TO RELATED APPLICATION

This application is based upon, claims the benefit of priority of, and incorporates by reference the contents of, Japanese Patent Application No. 2003-47471 filed on Feb. 25, 2003.

FIELD OF THE INVENTION

The present invention relates to a clock generating circuit having a reference clock oscillating circuit for outputting a reference clock signal and a frequency multiplying circuit for multiplying the frequency of the reference clock signal through digital processing and outputting a frequency-multiplied signal.

BACKGROUND OF THE INVENTION

JP-A-2000-339055 (Patent Document 1) discloses a semiconductor integrated circuit device in which power consumption can be reduced when an internal circuit is in an operation-stopped state and the operation of the internal circuit can be restored at high speed. Specifically, the semiconductor integrated circuit device is equipped with a clock generating circuit having a relatively long clock stable time and another clock generating circuit having a relatively short clock stable time. According to this device, when the operation of the internal circuit of the semiconductor integrated circuit device is stopped, the clock generating circuit concerned is also stopped, and when the operation of the internal circuit is restored to a normal operation state, one of the clock generating circuits generates a clock signal at high speed.

Furthermore, JP-A-2000-357947 (Patent Document 2) discloses a clock control circuit which can immediately start the operation of a clock synchronization circuit when a low power consumption mode is switched to a standby mode. Specifically, the clock control circuit includes a multi-phase clock signal outputting means for generating and outputting a multi-phase clock signal having a predetermined phase difference by a digitally controlled oscillating operation and a frequency multiplying circuit for measuring the period of a reference clock signal output from a reference clock oscillating circuit based on a period of the multi-phase clock signal. The frequency multiplying circuit generates and outputs an n-multiplied clock signal achieved by n-multiplying the frequency of the reference clock signal based on the measurement value with the phase difference of the multi-phase clock signal as a resolution. The clock control circuit also includes a low power consumption control means for stopping the oscillating operation of the multi-phase clock signal output means when the operation of a clock synchronizing circuit, which operates upon an input of the n-multiplied clock signal output from the frequency multiplying circuit to a clock input terminal, is stopped to shift the system to the low power consumption mode.

In general, the clock generating circuit comprises an oscillator and an oscillating circuit. When a system clock having a higher frequency than the oscillation frequency of the oscillator is needed, a frequency multiplying circuit is used as the oscillating circuit. Some frequency multiplying circuits comprise analog circuits. However, recently, digital circuits having a short rise-up time are more frequently used.

The frequency multiplying circuit in the clock control circuit disclosed in the Patent Document 2 is also constructed by a digital type circuit.

In order to achieve a multiplied system clock described above in the oscillating circuit described above, it is needed to set a primarily-oscillating oscillator to an oscillation state. However, when the oscillator is actuated, the current consumption at the site concerned is increased, so that the overall current consumption of the microcomputer is increased. Furthermore, when the oscillator is actuated, unnecessary radiation noise from the site concerned is also increased.

SUMMARY OF THE INVENTION

The present invention has been implemented in view of the foregoing situation, and has an object to provide a clock generating circuit with which current (power) consumption and unnecessary radiation noise caused by the operation of an oscillator can be reduced in a frequency multiplying circuit for multiplying and outputting the frequency of a reference clock signal through digital processing.

According to a first aspect of the present invention, an oscillation control unit outputs an oscillation control signal, and gives an oscillation permitting instruction to a reference clock oscillating circuit for only a predetermined time of every predetermined time period. A reference clock oscillating circuit carries out an oscillating operation to output a reference clock signal during a period for which the oscillation permitting instruction is given based upon the oscillation control signal, and also stops the oscillating operation during a period for which an oscillation stop instruction is given based upon the oscillation control signal. By carrying out such an intermittent oscillating operation as described above, the current consumption and the unnecessary noise reduce as the reference clock oscillating circuit, that is, as the overall clock generating circuit can be more greatly reduced by the amount corresponding to provision of the oscillation stop period as compared with the conventional clock generating circuit which continues to output the reference clock signal.

Even during a period for which the oscillating operation of the reference clock oscillating circuit is stopped and no reference clock signal is input, a frequency multiplying circuit can multiply the reference clock signal based on the period data of the reference clock signal, which have been input from the reference clock oscillating circuit previously, and output the multiplied clock signal thus generated.

That is, a measuring clock output unit generates a measuring clock signal having a higher frequency than the frequency of the reference clock signal through the oscillating operation based on the digital control, and a measuring unit measures the period of the reference clock signal on the basis of the period of the measuring clock signal during the oscillation permitting instruction period. The period data thus measured are held in the period data holding unit.

A multiplying unit carries out the multiplying operation on the basis of the latest period data successively measured during an oscillation permitting instruction period, and also carries out the multiplying operation on the basis of the period data held in the period data holding unit during an oscillation stop instruction period. The reference clock oscillating circuit comprises a quartz oscillator, ceramic oscillator or the like which has low frequency variation and high precision, and the period data is fixed if there is no frequency variation in the measuring clock signal. Therefore, even when no reference clock signal is given, the frequency multiplying circuit can output the multiplied clock signal by using the period data thus held.

However, if a temperature variation or voltage variation occurs, the frequency of the measuring clock signal might vary. In this case, during the oscillation permitting instruction period, the period of the reference clock signal is measured on the basis of the period of the measuring clock signal at the present time point, and the period data thus measured is multiplied on the basis of the period of the measuring clock signal at the present time point. Therefore, the frequency error of the multiplied clock signal output from the frequency multiplying circuit is extremely reduced. On the other hand, during the oscillation stop instruction period, the period of the measuring clock signal used to achieve the period data held and the period of the measuring clock signal used for the frequency multiplication at the present time point are different from each other. Therefore, some dispersion also occurs in the frequency of the multiplied clock signal.

Therefore, according to the present invention, under the state that the oscillating operation of the reference clock oscillating circuit is stopped, the reference clock oscillating circuit is made to carry out the oscillating operation every predetermined time to input the reference clock signal to the frequency multiplying circuit. As a result, the period data is renewed (corrected) on the basis of the period of the measuring clock signal at the present time point every predetermined time, and the dispersion in frequency of the multiplied clock signal due to the frequency variation of the measuring clock signal can be suppressed. The renewal period may be determined on the basis of the frequency variation rate (frequency stability) of the measuring clock signal or the like.

According to a second aspect of the present invention, since the reference clock oscillating circuit is made to carry out the oscillating operation for only a fixed period of time every fixed time, the frequency multiplying circuit is renewed every fixed time concerned. This fixed time interval may be properly determined on the basis of a temperature atmosphere, voltage atmosphere or the like under which the clock generating circuit is used so that the frequency dispersion in multiplied clock signal is within a specification range.

According to a third aspect of the present invention, the oscillation control unit is equipped with a temperature detecting unit for detecting the temperature of the measuring clock output unit, and controls the time interval for giving the oscillation permitting instruction on the basis of the detected temperature. Therefore, the frequency error of the multiplied clock signal due to the frequency variation of the measuring clock signal which is caused by the temperature variation can be reduced. Accordingly, the high-precision multiplied clock signal can be achieved along with a maximum reduction in current consumption by the clock generating circuit and unnecessary radiation noise.

According to a fourth aspect of the present invention, the time interval of the oscillation permitting instruction, that is, the renewal time interval is controlled to be shortened as the variation rate of the detected temperature is increased. In general, the frequency variation of the measuring clock signal trends to increase as the temperature variation rate of the measuring clock output unit is larger. By applying this invention, the high-precision multiplied clock signal can be achieved.

According to a fifth aspect of the present invention, in the construction of the fourth aspect, the renewal of the frequency multiplying circuit is carried out every fixed time even when the magnitude of the variation rate of the detected temperature is equal to a predetermined value or less. Therefore, even when dispersion occurs in the frequency of the measuring clock signal due to some cause other than the temperature variation of the measuring clock output unit, the precision of the multiplied clock signal can be kept high.

According to sixth and seventh aspects of the present invention, the period data are held in a period data holding unit. The period data holding unit holds the latest period data (measured at the time point at which the oscillation control signal is changed from the oscillation permitting instruction to the oscillation stop instruction) out of the period data which have been successively measured during the oscillation permitting instruction period, or the period data every measurement during the oscillation permitting instruction period.

According to an eighth aspect of the present invention, when an external circuit operating on the basis of the multiplied clock signal is shifted to a low power consumption operating mode, the oscillating operation of the reference clock oscillating circuit and the operation of the measuring clock output unit are stopped, so that the current consumption of the clock generating circuit can be sufficiently reduced.

According to a ninth aspect of the present invention, the measuring clock output unit generates a multi-phase clock signal having a predetermined phase-difference, and the multiplying unit multiplies the frequency of the reference clock signal with the phase difference of the multi-phase clock signal as a resolution. Therefore, the multiplication rate can be further enhanced. Accordingly, the frequency of the reference clock signal can be lowered, and the current consumption of the reference clock oscillating circuit and the unnecessary radiation noise can be further reduced.

According to a tenth aspect of the present invention, the measuring clock output unit is constructed as a ring oscillator achieved by connecting plural logic inversion circuits in a ring shape, and thus a multi-phase clock signal can be easily achieved from the output terminal of a predetermined logic inversion circuit. Furthermore, the phase difference of the multi-phase clock signal is determined in accordance with the gate delay time of the logic inversion circuit, so that the oscillation frequency of the multi-phase clock signal can be easily set to an extremely high value. As a result, the resolution to generate the multiplied clock signal can be set to a high value, and also the adjustment, etc. of the resolution can be easily preformed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Preferred embodiments according to the present invention will be described hereunder with reference to the accompanying drawings.

(First Embodiment)

A first embodiment according to the present invention will be described with reference to FIGS. 1 to 3.

Figure 1:
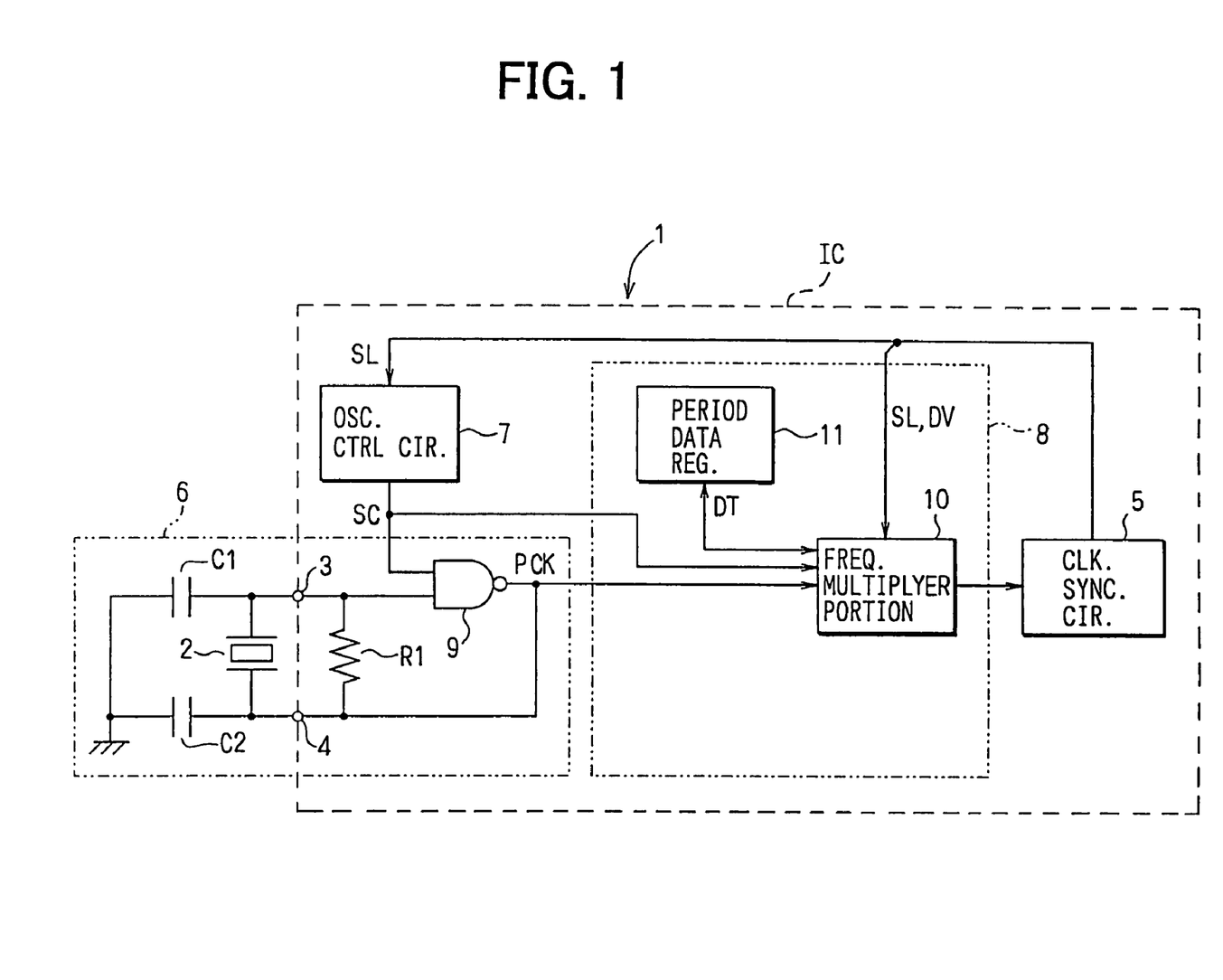
FIG. 1 is a circuit diagram of a clock generating circuit according to a first preferred embodiment.
Figure 2:
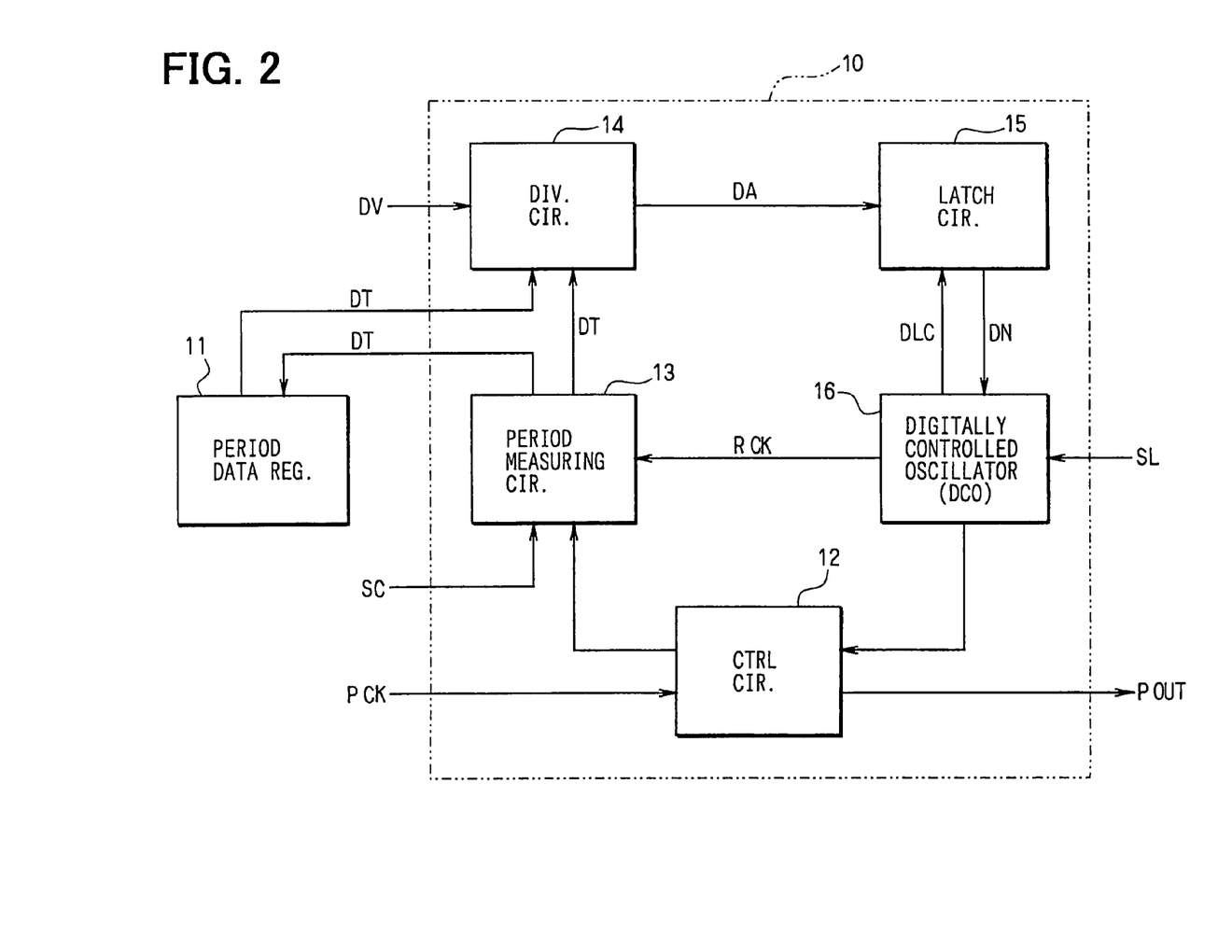
FIG. 2 is a functional block diagram of a frequency multiplying circuit.

FIG. 1 is a block diagram showing the overall electrical construction of a clock generating circuit.

The clock generating circuit 1 is designed as a semiconductor integrated circuit device (IC) to be mounted on a control board equipped to an ECU (Electronic Control Unit) for a vehicle. An oscillator 2 such as a quartz oscillator, a ceramic oscillator or the like and capacitors C1, C2 appended to the oscillator 2 are externally equipped adjacent to the IC through terminals 3, 4 of the IC. The IC carries out the control of ECU, and is equipped with a clock synchronizing circuit 5 (corresponding to an external circuit) comprising CPU, a memory, a gate array, etc.

The clock generating circuit 1 comprises a reference clock generating circuit 6, an oscillation control circuit 7 and a frequency multiplying circuit 8. The reference clock oscillating circuit 6 comprises the oscillator 2, the capacitors C1, C2, a resistor R1 and an NAND gate 9. One input terminal of the NAND gate 9 is connected to a terminal 3 of the IC, and the other input terminal thereof is supplied with an oscillation control signal SC from an oscillation control circuit 7. Furthermore, the output terminal of the NAND gate 9 is connected to a terminal 4 of IC. The reference clock oscillating circuit 6 is designed so as to make the oscillator 2 oscillate to output reference clock signals PCK during a period for which the oscillation control signal SC is set to H level (corresponding to an oscillation permitting instruction) and stop the oscillation of the oscillator 2.

The oscillation control circuit 7 outputs the oscillation control signal SC which is kept to H level for a fixed period of time for every fixed time interval (see FIG. 3), and it is supplied with a sleep signal SL indicating a shift state to a sleep mode (low power consumption operation mode) from the clock synchronizing circuit 5. When the sleep signal SL is set to H level indicating the sleep state, the oscillation control circuit 7 sets the oscillation control signal SC to L level.

The frequency multiplying circuit 8 comprises a frequency multiplying portion 10 and a period data register 11 which are preferably formed from digital circuits. As shown in FIG. 2, the frequency multiplying portion 10 comprises a control circuit 12, a period measuring circuit 13, a dividing circuit 14, a latch circuit 15 and a digital controlled oscillator 16 (DCO).

The period measuring circuit 13 (corresponding to measuring unit) measures the period of the reference clock signal PCK supplied from the control circuit 12 on the basis of the period of a measuring clock signal RCK supplied from the DCO 16. Specifically, the period measuring circuit 13 measures the number of clocks of the measuring clock signal RCK input during one period of the reference clock signal PCK every predetermined number of periods of the reference clock signal PCK (for example, every 8 periods) by using a counter (not shown) contained in the period measuring circuit 13, and outputs the count value as period data DT to the dividing circuit 14. The period data DT is stored in a period data register 11 (corresponding to period data holding unit).

The dividing circuit 14 divides the period data DT by multiplication number setting data DV to achieve division data DA. The multiplication number setting data DV is supplied from the clock period circuit 5 for setting the multiplication number of the frequency multiplying circuit 8. During the period for which the oscillation control signal SC is set to H level, the period data DT to be subjected to division calculation corresponds to the latest period data DT which is successively measured in the period measuring circuit 13, and during the period for which the oscillation control signal SC is set to the L level, the period data DT to be subjected to division calculation corresponds to the period data DT stored in the period data register 11.

On the basis of the division data DA, the latch circuit 15 generates count number data DN to be counted by a ring oscillator (described later) in DCO 16. The count number data DN thus generated is output to DCO 16 in synchronism with a latch signal DLC from DCO 16.

DCO 16 (corresponding to a measuring clock output unit) contains a ring oscillator achieved by connecting plural logic-inverting circuits connected in a ring shape to generate the measuring clock signal RCK. DCO 16 counts the count number data DN on the basis of a measuring clock signal RCK to output a multiplied clock signal POUT. The multiplied clock signal POUT is input to the control circuit 12 to correct the phase difference thereof from the reference clock signal PCK, and then output as a multiplied clock signal POUT to the clock synchronizing circuit 5. The dividing circuit 14, the latch circuit 15 and DCO 16 constitute the multiplying unit.

Figure 3:
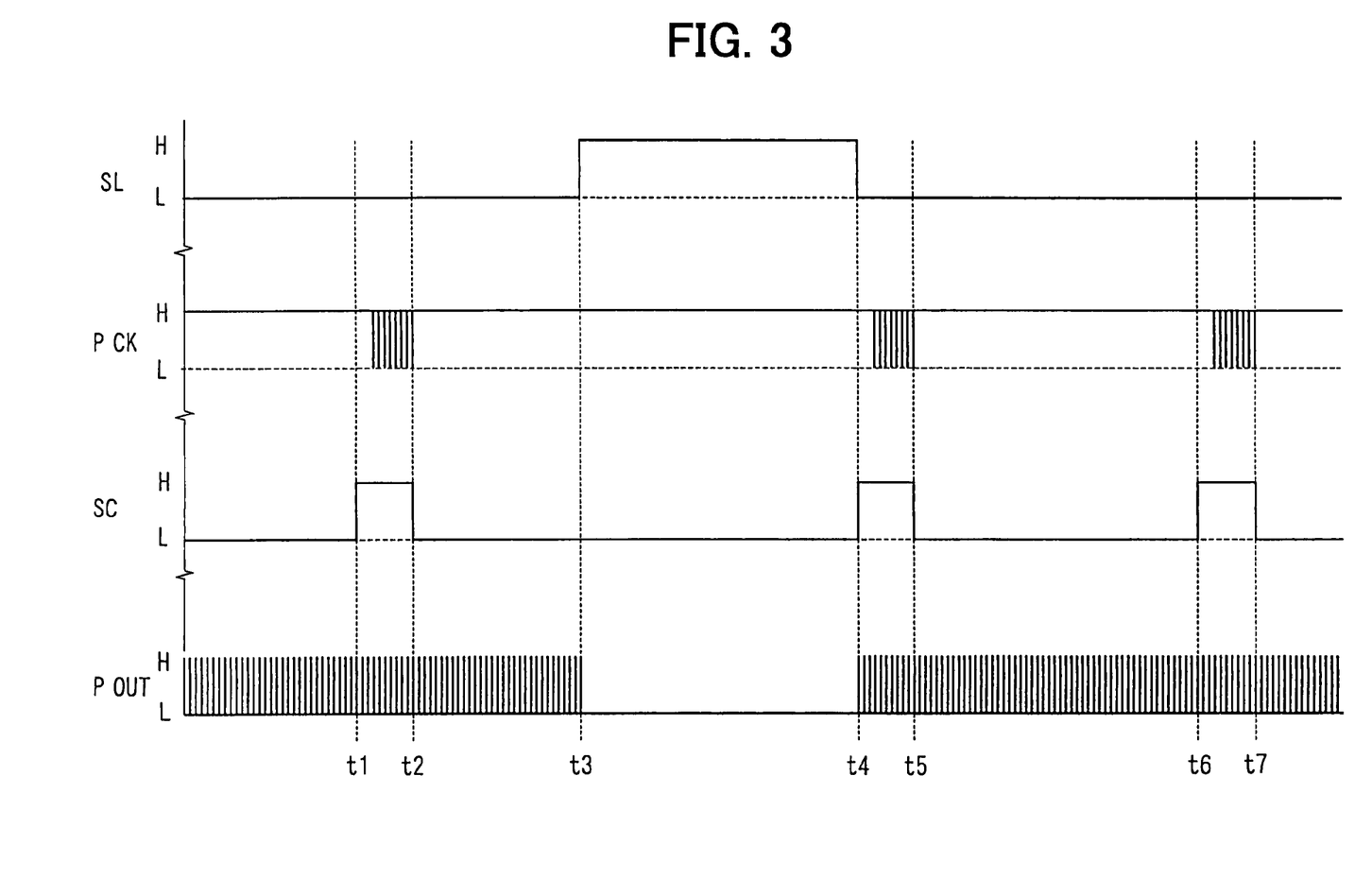
FIG. 3 is a timing chart showing the overall operation of the clock generating circuit.

Referring to FIG. 3, operation will be discussed. First, the basic operation of the frequency multiplying circuit 8 will be described. The ring oscillator equipped in DCO 16 outputs a measuring clock signal RCK having a sufficiently higher frequency (for example, 400 MHz) than the frequency (for example, 4 MHz) of the reference clock signal PCK. The measuring clock signal RCK serves as a fundamental clock when the measurement of the period of the reference clock signal PCK in the period measuring circuit 13 and the frequency multiplication in DCO 16 are performed.

In order to multiply the reference clock signal PCK, the multiplied clock signal POUT may be merely output every time the measuring clock signal RCK counts the division value (DT/DV), and the count number data DN in which the integer portion and the decimal portion of the division value (division data DA) are adjusted are generated in the latch circuit 15. DCO 16 carries out the count operation according to the count number data DN, and generates the multiplied clock signal POUT. That is, in the case where the frequency multiplying circuit 8 is not actually supplied with any reference clock signal PCK, if some data is supplied to the dividing circuit 14, the frequency multiplying circuit 8 regards the data concerned as period data DT, and outputs the multiplied clock signal POUT corresponding to the period data DT concerned.

FIG. 3 is a timing chart showing the overall operation of the clock generating circuit 1. In FIG. 3, the sleep signal SL, the reference clock signal PCK, the oscillation control signal SC and the multiplied clock signal POUT are successively shown in this order from the upper side.

Taking advantage of the characteristic of the frequency multiplication circuit 8, the reference clock oscillating circuit 6 of the clock generating circuit 1 has a period for which oscillation is stopped even when the clock synchronizing circuit 5 is set to a normal operation mode (the sleep signal SL is set to L level). That is, the oscillation control circuit 7 makes the reference clock oscillating circuit 6 carry out the oscillating operation intermittently by setting the oscillation control signal SC from L level to H level for only a fixed period of time during every fixed time interval (for example, the period from time t1 to t2, the period from time t4 to t5 and the period from time t6 to t7 in FIG. 3). The time delay corresponding to an oscillation rise-up time exists before the reference clock signal PCK is output after the setting of the oscillation control signal SC to H level. The time period for the H level is required to be longer than the oscillation rise-up time of the reference clock oscillating circuit 6 and the oscillation rise-up time of DCO 16.

When the clock synchronizing circuit 5 is set to the sleep mode (the sleep signal SL is set to H level), the supply of the multiplied clock signal POUT to the clock synchronizing circuit 5 becomes unnecessary. Therefore, the oscillation control circuit 7 sets the oscillation control signal SC to L level to stop the oscillation of the reference clock oscillating circuit 6, and the frequency multiplying circuit 8 stops the ring oscillator to stop the multiplication operation (the period from time t3 to t4).

Through the series of operations described above, during the period for which the reference clock oscillating circuit 6 is set to the oscillation state and the reference clock signal PCK is input to the frequency multiplying circuit 8, the period of the reference clock signal PCK is successively measured every 8 periods of the measuring clock signal RCK by using the measuring clock signal RCK at that time point in the period measuring circuit 13. The frequency multiplying circuit 8 carries out the frequency multiplication on the basis of the measuring clock signal RCK substantially at the same time point as the period data DT (accurately, the period of 8 periods before next measurement is carried out). Therefore, even when the frequency of the measuring clock signal RCK is varied, the frequency error of the multiplied clock signal POUT is extremely reduced.

On the other hand, during the period for which no reference clock signal PCK is input, no period data DT is achieved. Therefore, the clock generating circuit 1 carries out the multiplication operation on the basis of past period data DT stored into the period data register 11 at the time when the level of the oscillation control signal is changed from H level to L level, and the measuring clock signal RCK at each time.

Since a high-precision oscillator which is small in frequency variation, such as a quartz oscillator, a ceramic oscillator or the like, is used as the oscillator 2 of the reference clock oscillating circuit 6, the period data DT would be fixed unless the frequency of the measuring clock signal RCK vary. However, if the frequency of the measuring clock signal RCK is varied due to temperature variation or voltage variation, the frequency of the measuring clock signal RCK used to measure the period data DT stored and the frequency of the measuring clock signal RCK used for the frequency multiplication at the present time are different from each other, so that there occurs some dispersion in the frequency of the multiplied clock signal POUT.

On the other hand, according to this embodiment, the reference clock oscillating circuit 6 is made to carry out the oscillation operation intermittently as described above, so that the period data DT is renewed (corrected) on the basis of the measuring clock signal RCK at that time point every fixed time. As a result, the dispersion in the frequency of the multiplied clock signal POUT is reset, and thus the error is not accumulated.

According to this embodiment described above, by adding the period data register 11 to the frequency multiplying circuit 8, the multiplication operation can be performed on the basis of the period data DT stored in the period data register 11. In addition, the reference clock oscillating circuit 6 is made to carry out the intermittent operation. Accordingly, as compared with the related art clock generating circuit which is designed to continue to output the reference clock signal PCK, the current consumption and the unnecessary radiation noise can be reduced by the amount corresponding to the oscillation stop period.

Furthermore, even when the frequency of the measuring clock signal RCK in the frequency multiplying circuit 8 is varied, the period data DT is renewed (corrected) every time the reference clock oscillating circuit 6 carries out the oscillating operation, and thus the clock generating circuit 1 can continue to output the high-precision multiplied clock signal POUT. The time interval of the intermittent operation may be suitably determined in accordance with the temperature atmosphere, the voltage environment, etc. under which the clock generating circuit 1 is used so that the frequency dispersion of the multiplied clock signal POUT is within a specification range.

Still furthermore, when the clock synchronizing circuit 5 is shifted to the sleep mode, the oscillating operation of the reference clock oscillating circuit 6 and the operation of the frequency multiplying circuit 8 are stopped, so that the current consumption of the clock generating circuit 1 can be extremely reduced.

(Second Embodiment)

Next, a second embodiment according to the present invention will be described with reference to FIGS. 4 and 5.

Figure 4:
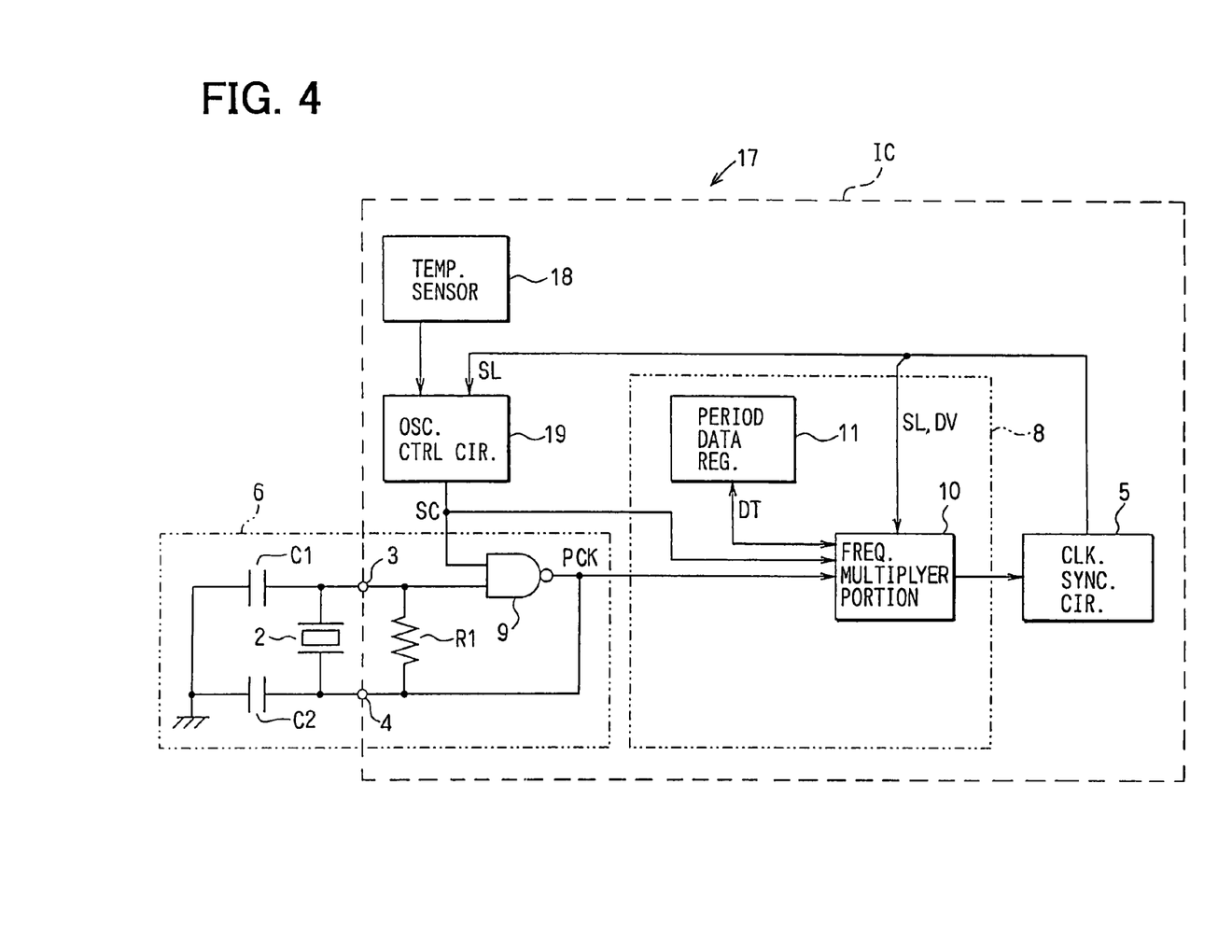
FIG. 4 is a circuit diagram of a clock generating circuit according to a second preferred embodiment.

FIG. 4 shows the overall electrical construction of a clock generating circuit according to the second embodiment. The same constituent elements as shown in FIG. 1 are represented by the same reference numerals. The clock generating circuit 17 shown in FIG. 4 is different from the clock generating circuit 1 shown in FIG. 1 in that it includes a temperature sensor 18 and a different type of oscillation control circuit 19.

The temperature sensor 18 (corresponds to temperature detecting unit) is equipped in the IC to detect the temperature of the IC, particularly the temperature of the frequency multiplying circuit 8.

In accordance with the magnitude of the variation rate of the detected temperature, the oscillation control circuit 19 controls the time interval at which the oscillation control signal SC is set to H level (oscillation permitting instruction). Specifically, in conformity with the temperature characteristic of the measuring clock signal RCK, the time interval between which the reference clock oscillating circuit 6 carries out the intermittent oscillation operation is controlled to be reduced as the variation rate (absolute value) of the detected temperature is increased. However, when the magnitude of the variation rate of the detected temperature is reduced to a predetermined value or less, the oscillation control signal SC is set to H level every relatively long fixed time to make the reference clock oscillating circuit 6 carry out the oscillating operation.

Figure 5:
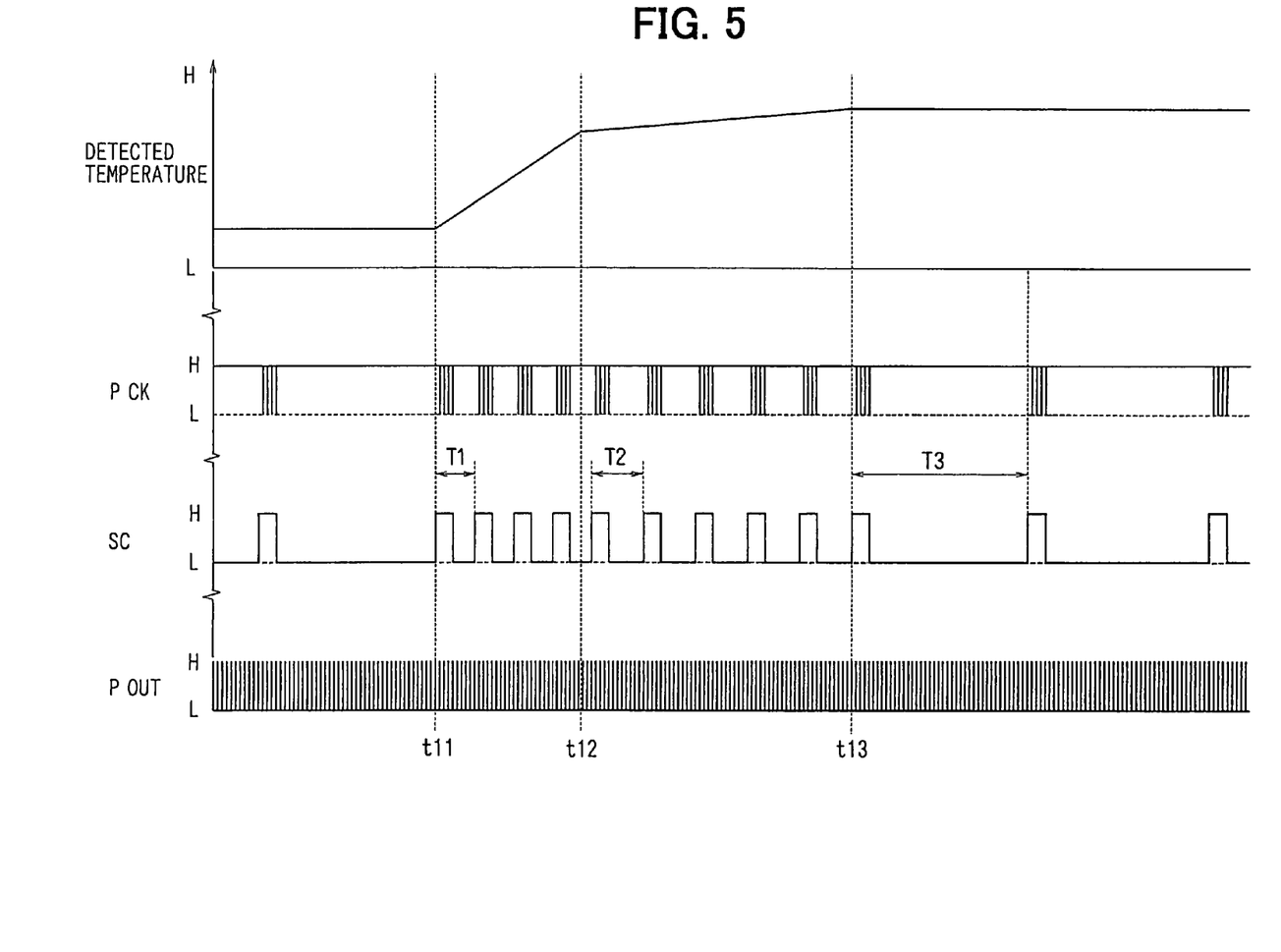
FIG. 5 is a timing chart showing the overall operation of the clock generating circuit together with detected temperature.

FIG. 5 is a timing chart showing the overall operation of the clock generating circuit 17 together with the detected temperature. The operation during the period for which the sleep signal SL is set to H level is the same as the first embodiment (see FIG. 3), and thus it is omitted from the illustration of FIG. 5. The reference clock oscillating circuit 6 carries out the oscillating operation intermittently at a relatively long period T3 to supply the reference clock signal PCK to the frequency multiplying circuit 8 before the time t11 and after the time t13 in which the variation rate of the detected temperature is equal to a predetermined value or less.

On the other hand, in the time zone from the time t11 to the time t12 during which the temperature of IC varies rapidly, the reference clock oscillating circuit 6 carries out the oscillating operation intermittently at a short period T1. Furthermore, in the time zone from the time t12 to the time t13 during which the temperature variation of IC is slightly moderated, the reference clock oscillating circuit 6 carries out the oscillating operation intermittently at a period T2 which is longer than the period T1 and shorter than the period T3.

DCO 16 of the frequency multiplying circuit 8 generates a measuring clock signal RCK with the ring oscillator. Therefore, when the operation temperature varies, the frequency of the measuring clock signal RCK may be varied. With respect to the related art clock generating circuit in which the reference clock signal PCK is input to the frequency multiplying circuit 8 at all times, the measurement of the period of the reference clock signal PCK and the multiplying operation based on the period data DT thus measured are carried out substantially at the same time, and thus the frequency error of the multiplied clock signal POUT occurs hardly even when the frequency of the measuring clock signal RCK varies.

On the other hand, with respect to the clock generating circuit 17 according to this invention, the reference clock signal PCK is input intermittently, and thus the frequency error corresponding to the frequency variation of the measuring clock signal RCK occurs during the period when no reference clock signal PCK is input. The detection of the temperature of IC is carried out to detect the frequency variation of the measuring clock signal RCK.

According to the oscillation control of this embodiment, when the frequency of the measuring clock signal RCK is varied due to the temperature variation, the reference clock signal PCK is input before the dispersion (difference) between the frequency of the measuring clock signal RCK used to measure the period data DT stored and the frequency of the measuring clock signal RCK used for the frequency multiplication at the present time is increased, and thus the period data DT is renewed on the basis of the measuring clock signal RCK at that time point. Accordingly, the frequency variation of the multiplied clock signal POUT can be suppressed irrespective of the temperature variation of the IC.

Furthermore, since the time interval of the intermittent oscillating operation is controlled in accordance with the variation rate of the detected temperature, it is unnecessary to set the reference clock oscillating circuit 6 to the oscillating operation state for any more time, so that the high-precision multiplied clock signal POUT can be achieved while reducing the current consumption of the clock generating circuit 17 and the unnecessary radiation noise at maximum.

Still furthermore, in the case where the magnitude of the variation rate of the detected temperature is equal to a predetermined value or less, the reference clock signal PCK is input to the frequency multiplying circuit 8 every predetermined constant time, and thus even when some dispersion occurs in the frequency of the measuring clock signal RCK due to some cause other than the temperature variation such as voltage variation or the like, the precision of the multiplied clock signal POUT can be prevented from being lowered.

(Other Embodiments)

The present invention is not limited to the respective embodiments described above with respect to the accompanying drawings, and the following modifications or expansion can be performed.

That is the oscillation control unit may output the oscillation control signal SC for instructing oscillation permission every predetermined time. The predetermined time is not necessarily a fixed time.

The frequency variation of the measuring clock signal RCK may also occur when the operating voltage of the frequency multiplied circuit 8 varies. Therefore, the above embodiments may be modified so that a voltage sensor for detecting the operating voltage or the battery voltage input to a power supply circuit (not shown) and the time interval of the intermittent oscillating operation is controlled in accordance with the voltage variation thus detected. The control based on the temperature sensor 18 and the control based on the voltage sensor may be carried out at the same time.

The temperature sensor 18 may be at the outside of IC insofar as it can detect the temperature of IC.

DCO 16 may be designed so as to generate a multi-phase clock signal having a predetermined phase difference and multiplying the frequency of the reference clock signal PCK with the phase difference of the multi-phase clock signal as a resolution to generate the multiplied clock signal POUT based on the period data DT.

Therefore, the present application concerns generally a clock generating circuit comprising a reference clock oscillating circuit 6 for outputting a reference clock signal PCK in response to an oscillation control signal; a period measuring circuit 13 for measuring a period of the reference clock signal PCK based upon a period of a measuring clock signal RCK having a higher frequency than the frequency of the reference clock signal PCK and outputting the measured period into a period data register; and a digital controlled oscillator 16 for supplying the measuring clock signal RCK and for generating a multiplied clock signal based upon a count number data corresponding to the measured period, wherein the count number data corresponds to the measured period in the period data register while the reference clock oscillating circuit 6 is not outputting the reference clock signal. In a second embodiment, the clock generating circuit comprises a temperature detecting unit for detecting the temperature of the digital controlled oscillator, wherein a frequency of the oscillation control signal is controlled in response to the detected temperature. The frequency of the oscillation control signal is fixed when a variation rate of the detected temperature falls below a predetermined value and the frequency of the oscillation control signal is increased as the absolute value of a variation rate of the detected temperature is increased and is above the predetermined value.

What is claimed is:

1. A clock generating circuit, comprising:
   a reference clock oscillating circuit for carrying out an oscillating operation to output a reference clock signal during a period for which an oscillation permitting instruction is given based upon an oscillation control signal, and stopping the oscillating operation to stop the output of the reference clock signal during a period for which an oscillation stop instruction is given based upon the oscillation control signal;
   an oscillation control unit for outputting the oscillation control signal to give the oscillation permitting instruction for a predetermined time of a predetermined time duration, wherein the oscillation control unit is equipped with a temperature detecting unit for detecting the temperature of a measuring clock output unit, and controls the time interval for giving the oscillation permitting instruction on the basis of the detected temperature; and a frequency multiplying circuit for multiplying and outputting the frequency of the reference clock signal through digital processing, wherein the frequency multiplying circuit comprises:

the measuring clock output unit for generating a measuring clock signal having a frequency higher than the frequency of the reference clock signal based upon the oscillating operation based on digital control;

a measuring unit for measuring the period of the reference clock signal on the basis of the period of the measuring clock signal during the oscillation permitting instruction period, thereby achieving period data;

a period data holding unit for holding the period data; and a multiplying unit for multiplying the frequency of the reference clock signal with the period of the measuring clock signal as a resolution based upon the period data successively measured during the oscillation permitting instruction period or on the basis of the period data held in the period data holding unit during the oscillation stop instruction period, thereby generating a multiplied clock signal.

2. The clock generating circuit according to claim 1, wherein the oscillation control unit controls the time interval for giving the oscillation permitting instruction so that the time interval is shorter as the variation rate of the detected temperature is increased.

3. The clock generating circuit according to claim 2, wherein the oscillation control unit gives the oscillation permitting instruction every fixed time when the magnitude of the variation rate of the detected temperature is equal to a predetermined value or less.

4. The clock generating circuit according to claim 3, wherein in period data which have been successively measured during the oscillation permitting instruction period, latest period data at the time point at which the oscillation control signal is changed from the oscillation permitting instruction to the oscillation stop instruction is held in the period data holding unit.

5. The clock generating circuit according to claim 3, wherein the period data successively measured during the oscillation permitting instruction period are held in the period data holding unit every time the measurement is carried out.

6. The clock generating circuit according to claim 5, wherein when an external circuit operating on the basis of the multiplied clock signal is shifted to a low power consumption operating mode, the oscillation control unit sets the oscillation control signal to the oscillation stop instruction, and also makes the measuring clock output unit stop the operation thereof.

7. The clock generating circuit according to claim 6, wherein the measuring clock output unit generates a multi-phase clock signal having a predetermined phase difference, and the multiplying unit multiplying the frequency of the reference clock signal with the phase-difference of the multi-phase clock signal as a resolution based upon the period data, thereby generating the multiplied clock signal.

8. The clock generating circuit according to claim 7, wherein the measuring clock output unit comprises a ring oscillator achieved by connecting plural logic inversion circuits in a ring shape.

9. A clock generating circuit comprising:

a reference clock oscillating circuit for outputting a reference clock signal in response to an oscillation control signal;

a period measuring circuit for measuring a period of the reference clock signal based upon a period of a measuring clock signal having a higher frequency than the frequency of the reference clock signal and outputting the measured period into a period data register;

a digital controlled oscillator for supplying the measuring clock signal and for generating a multiplied clock signal based upon count number data corresponding to the measured period, wherein the count number data corresponds to the measured period in the period data register while the reference clock oscillating circuit is not outputting the reference clock signal; and a temperature detecting unit for detecting the temperature of the digital controlled oscillator, wherein a frequency of the oscillation control signal is controlled in response to the detected temperature.

10. The clock generating circuit of claim 9, wherein the frequency of the oscillation control signal is fixed when a variation rate of the detected temperature falls below a predetermined value and the frequency of the oscillation control signal is increased as the absolute value of a variation rate of the detected temperature is increased and is above the predetermined value.

* * * * *